United States Patent
Ishikawa (10) Patent No.: US 10,372,544 B2
(45) Date of Patent: Aug. 6, 2019

(54) APPARATUS INCLUDING REFRESH CONTROLLER CONTROLLING REFRESH OPERATION RESPONSIVE TO DATA ERROR

(71) Applicant: Micron Technology, Inc., Boise, ID (US)

(72) Inventor: Toru Ishikawa, Kanagawa (JP)

(73) Assignee: Micron Technology, Inc., Boise, ID (US)

(*) Notice: Subject to any disclaimer, the term of this patent is extended or adjusted under 35 U.S.C. 154(b) by 10 days.

(21) Appl. No.: 14/805,072

(22) Filed: Jul. 21, 2015

(65) Prior Publication Data
US 2016/0026533 A1    Jan. 28, 2016

(30) Foreign Application Priority Data
Jul. 22, 2014   (JP) .................................. 2014-148890

(51) Int. Cl.
G06F 11/14      (2006.01)
G11C 11/406    (2006.01)
G11C 29/04     (2006.01)

(52) U.S. Cl.
CPC ........ *G06F 11/1441* (2013.01); *G11C 11/406* (2013.01); *G06F 2201/85* (2013.01); *G11C 2029/0411* (2013.01); *G11C 2211/4061* (2013.01); *G11C 2211/4062* (2013.01)

(58) Field of Classification Search
CPC ............ G06F 11/1441; G06F 2201/85; G11C 11/406; G11C 2029/0411; G11C 2211/4062; G11C 2211/4061
See application file for complete search history.

(56) References Cited

U.S. PATENT DOCUMENTS

| | | | |
|---|---|---|---|
| 2005/0249010 A1* | 11/2005 | Klein | G11C 7/20 365/222 |
| 2011/0134708 A1* | 6/2011 | Klein | G11C 7/1006 365/189.07 |
| 2015/0026537 A1* | 1/2015 | Romanovskyy | G11C 11/406 714/764 |

FOREIGN PATENT DOCUMENTS

| | | |
|---|---|---|
| JP | 2001-250378 | 9/2001 |
| JP | 2002-025299 | 1/2002 |
| JP | 2011-165243 | 8/2011 |

* cited by examiner

*Primary Examiner* — April Y Blair
*Assistant Examiner* — Rong Tang
(74) *Attorney, Agent, or Firm* — Dorsey & Whitney LLP (57) ABSTRACT

A device includes a plurality of memory cells, an error detection circuit configured to detect at least one memory cell storing error data and a refresh control circuit including a register configured to store an error address corresponding to the at least one memory cell storing error data. The refresh control circuit is configured to control a refresh cycle of the error address.

16 Claims, 7 Drawing Sheets

APPARATUS INCLUDING REFRESH CONTROLLER CONTROLLING REFRESH OPERATION RESPONSIVE TO DATA ERROR

This application is based upon and claims the benefit of priority from Japanese Patent Application No. 2014-148890 filed on Jul. 22, 2014, the disclosure of which are incorporated herein in its entirely by reference.

BACKGROUND OF THE INVENTION

The present invention relates to a semiconductor device and particularly to a semiconductor device capable of verifying whether user data includes an error or not.

Some semiconductor devices, such as Dynamic Random Access Memories (DRAMs), have a user data error correction function. Such a semiconductor device includes a separate memory area for storing error check and correction information (ECC), in addition to a memory area for storing user data. See Japanese patent Laid Open publication No. 2002-25299, for example. The above semiconductor device corrects user data read in a read operation based on error correction information, and outputs the corrected user data to the outside. When carrying out a write operation, the semiconductor device generates error correction information, based on externally input user data, and writes the user data and the error correction information respectively to corresponding memory areas.

The semiconductor device described in the publication No. 2002-25299 has a function of switching a refresh cycle chip by chip according to an error rate, thus reducing the error rate of each chip to a certain error rate or less. Japanese patent Laid Open publication No. 2001-250378 discloses a DRAM having an error correction function. Japanese patent Laid Open publication No. 2011-165243 discloses a DRAM that sets a variable refreshing cycle.

DETAILED DESCRIPTION OF THE EMBODIMENTS

Figure 1:
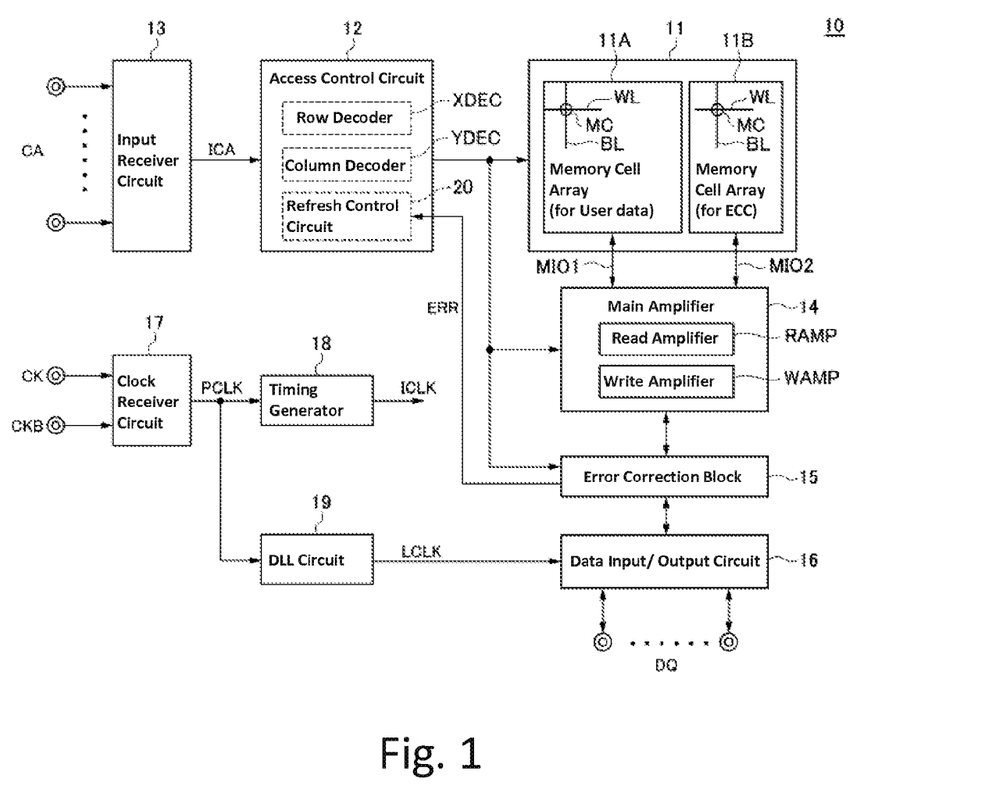
FIG. 1 is a block diagram of a configuration of a semiconductor device according to one embodiment of the present invention.

FIG. 1 is a block diagram of a configuration of a semiconductor device 10 according to one embodiment of the present invention.

The semiconductor device 10 includes a memory cell array unit 11 that can store data. The memory cell array unit 11 has a memory cell array 11A that can store user data (DQ) and a memory cell array 11B that can store error correction information (ECC), which is verification data. Each of the memory cell arrays 11A and 11B has multiple word lines WL, multiple bit lines BL, and multiple DRAM cells arranged at the intersections of the word lines WL and the bit lines BL.

The semiconductor device 10 includes an access control circuit 12 for accessing the memory cell array unit 11. The access control circuit 12 controls operations of various circuit blocks included in the semiconductor device 10, based on an internal command address signal ICA. The semiconductor device 10 includes an input receiver 13 that generates the internal command address signal ICA based on an external command address signal CA. The access control circuit 12 has a row decoder XDEC, a column decoder YDEC, and a refresh control circuit 20. The row decoder XDEC accesses the memory cell array 11 in a row direction, while the column decoder YDEC accesses the memory cell array 11 in a column direction. The refresh control circuit 20 will be described in detail later.

When a column access is performed the memory cell array 11, the memory cell arrays 11A and 11B are electrically connected to a main amplifier 14. The memory cell array 11A is connected to the main amplifier 14 via a main data line MIO1, while the memory cell array 11B is connected to the main amplifier 14 via a main data line MIO2. The main amplifier 14 has a read amplifier RAMP and a write amplifier WAMP. The read amplifier RAMP can be activated at execution of a read operation, to amplify user data DQ and error correction information ECC, as verification data, read out from the memory cell array 11A and the memory cell array 11B via the main data line MIO1 and the main data line MIO2, respectively. The write amplifier WAMP can be activated at execution of a write operation, to write user data DQ and error correction information ECC to the memory cell array 11A and the memory cell array 11B via the main data line MIO1 and the main data line MIO2, respectively.

The main amplifier 14 is connected to a data input/output circuit 16 via an error correction block 15, which will be described in detail later. At execution of the read operation, the data input/output circuit 16 outputs user data DQ corrected by the error correction block 15 to outside of the semiconductor device 10. At execution of the write operation, the data input/output circuit 16 transfers externally input user data DQ to the error correction block 15 from external terminals.

The semiconductor device 10 includes a clock receiver circuit 17 that can receive complementary external clock signals CK and CKB and that can generate an internal clock signal PCLK. The internal clock signal PCLK is supplied to a timing generator 18 and to a DLL circuit 19. The timing generator 18 can generate an internal clock signal ICLK, based on the internal clock signal PCLK. The internal clock signal ICLK may be supplied to various circuit blocks including the access control circuit 12 and the amplifier 14. The DLL circuit 19 can generate a phase-controlled output clock signal LCLK, based on the internal clock signal PCLK. The output clock signal LCLK may be supplied to the data input/output circuit 16, where the output clock signal LCLK determines timing of outputting user data DQ from the data input/output circuit 16 to the outside.

Figure 2:
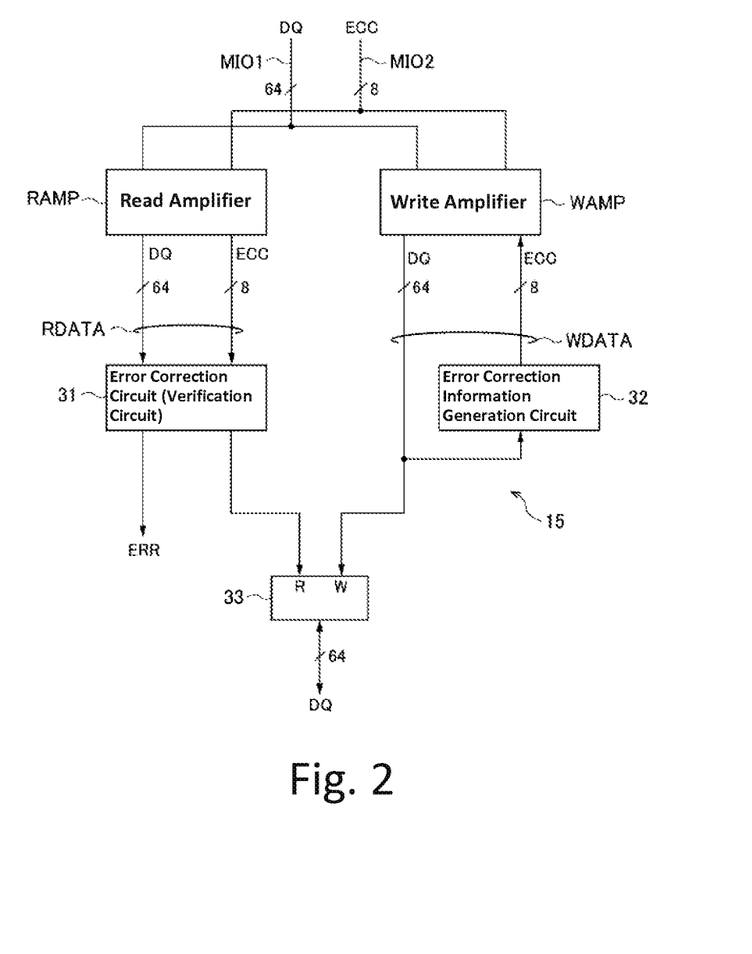
FIG. 2 is a block diagram of a configuration of an error correction block.

FIG. 2 is a block diagram of a configuration of the error correction block 15. The error correction block 15 has an error correction circuit 31 that can perform an error correction process based on 64-bit user data DQ read out from the memory cell array 11A and on 8-bit error correction information ECC read out from the memory cell array 11B. The error correction block 15 also has an error correction information generation circuit 32 that can generate 8-bit error correction information ECC based on 64-bit user data DQ supplied to the write amplifier WAMP.

The error correction circuit 31 can verify 64-bit user data DQ for error, using 8-bit error correction information, and when the user data DQ includes an error, corrects the user data DQ. The corrected user data DQ is transferred to the data input/output circuit 16 via a selector switch 33. The selector switch 33 selects a read node R at execution of the read operation, while selects a write node W at execution of the write operation. In such a configuration, at execution of the read operation, 64-bit user data DQ corrected using error correction information ECC can be output to the outside of the semiconductor device 10.

64-bit user data DQ is input to the semiconductor device 10 at execution of the write operation and is supplied to the write amplifier WAMP and to the error correction information generation circuit 32. Based on the 64-bit user data DQ, the error correction information generation circuit 32 generates 8-bit error correction information ECC and supplies it to the write amplifier WAMP. As a result, the 64-bit user data DQ is written to the memory cell array 11A while the 8-bit error correction information ECC is written to the memory cell array 11B.

Figure 3:
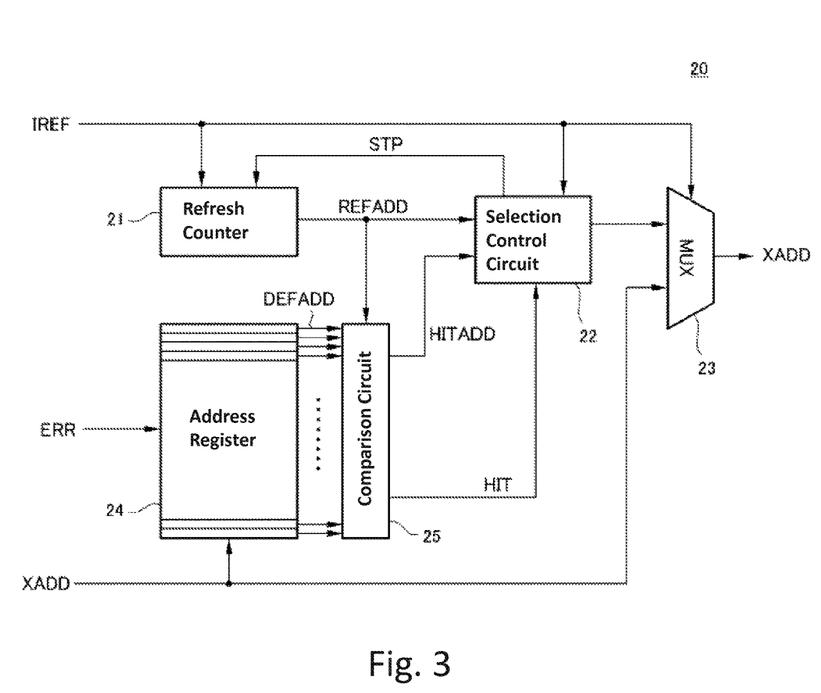
FIG. 3 is a block diagram of a configuration of a refresh control circuit according to a first embodiment.

FIG. 3 is a block diagram of a configuration of the refresh control circuit 20 according to a first embodiment. As shown in FIG. 3, the refresh control circuit 20 includes a refresh counter 21 that can store the address of a word line subjected to the refresh operation. The refresh counter 21 can update its count value in response to a refresh signal IREF. Multiple word lines can be thus refreshed in sequence in response to refresh signals IREF.

When the refresh signal IREF is activated, a refresh address REFADD, which is a count value of the refresh counter 21, is supplied as a row address XADD, to the memory cell array unit 11 via a selection control circuit 22 and a multiplexer 23. As a result, in the memory cell array unit 11, a word line indicated by the refresh address REFADD is selected and multiple memory cells connected to the word line are refreshed. The refresh signal IREF is one type of an internal command address signal ICA that is activated at execution of the refresh operation, and is activated, for example, when an external auto-refresh command is issued. When a self-refresh mode is set active, the refresh signal IREF is automatically generated in a cyclic manner.

The refresh signal IREF is supplied to the refresh counter 21, whose count value is updated in response to the refresh signal IREF. When the refresh signal IREF is activated given times, the refresh counter 21 completes its one round of count value updating. When the refresh counter 21 completes its one round of count value updating, all the word lines included in the memory cell array unit 11 are refreshed.

When the row address XADD is input together with an active command, to the refresh control circuit 20, the row address XADD is supplied to the memory cell array unit 11 via the multiplexer 23. As a result, in the memory cell array unit 11, a word line indicated by the row address XADD is selected and data is read from multiple memory cells connected to the word line.

As described above referring to FIG. 2, user data DQ and error correction information ECC read from the memory cell array unit 11 are supplied to the error correction block 15 via the main amplifier 14. The error correction circuit 31 of the error correction block 15 executes verification of the user data DQ. When the verification reveals that the user data DQ does not include an error, the user data DQ read from the memory cell array unit 11 is transferred to the data input/output circuit 16 via the selector switch 33 and is output to the outside of the semiconductor device 10.

When the user data DQ include an error, the error correction circuit 31 corrects the error included in the user data DQ, using the error correction information ECC. The user data DQ corrected is transferred to the data input/output circuit 16 via the selector switch 33 and is output to the outside of the semiconductor device 10. When performing error correction, the error correction circuit 31 can activate an error signal ERR. The error signal ERR is supplied to an address register 24 included in the refresh control circuit 20.

The address register 24 can latch the row address XADD, based on the activated error signal ERR. In other words, the address register 24 can store therein the row address DEFADD of a memory cell storing wrong data.

The row address DEFADD stored in the address register 24 is supplied to a comparison circuit 25, which compares the refresh address REFADD output from the refresh counter 21 with the row address DEFADD stored in the address register 24. Based on this comparison, the comparison circuit 25 activates a detection signal HIT when a given condition is met. The detection signal HIT is supplied to the selection control circuit 22. When the detection signal HIT is activated, the selection control circuit 22 selects a row address HITADD having caused the activation of the detection signal HIT out of row addresses DEFADD stored in the address register 24, instead of selecting the refresh address REFADD, and supplies the row address HITADD to the multiplexer 23.

Figure 4:
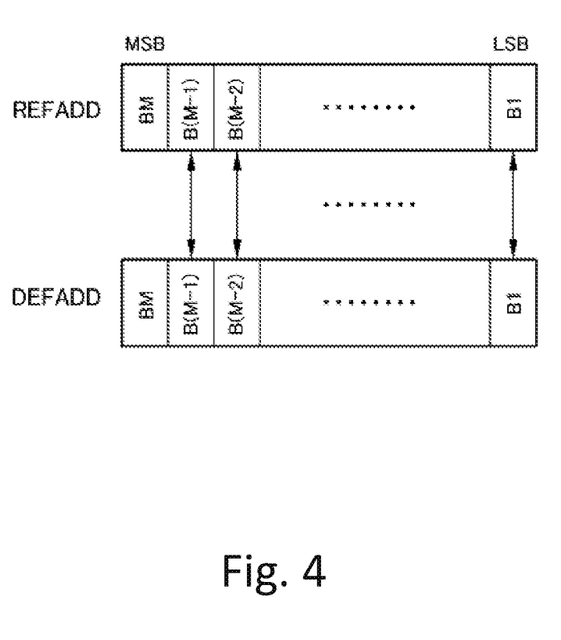
FIG. 4 is a schematic diagram explaining a first example of a comparison method carried out by a comparison circuit.

FIG. 4 is a schematic diagram explaining a first example of a comparison method carried out by the comparison circuit 25. As shown in FIG. 4, each of the refresh address REFADD and the row address DEFADD includes M bits ranging from the most significant bit (MSB) to the least significant bit (LSB). The comparison circuit 25 compares the refresh address REFADD and the row address DEFADD in such a way that their (M−1)-bit portions not including the most significant bits BM, i.e., portions including B(M−1) bit to B1 bit, are compared with each other. When the (M−1)-bit portions of the refresh address REFADD and row address DEFADD matches, the comparison circuit 25 activates the detection signal HIT. In this example, the comparison is made with the most significant bit BM being set aside. As a result, the detection signal HIT is activated twice for one row address DEFADD as the refresh counter 21 completes its one round of count value updating. In this case, the frequency of refreshing memory cells on the row address DEFADD is two times the frequency of refreshing memory cells on a row address other than the row address DEFADD.

Figure 5:
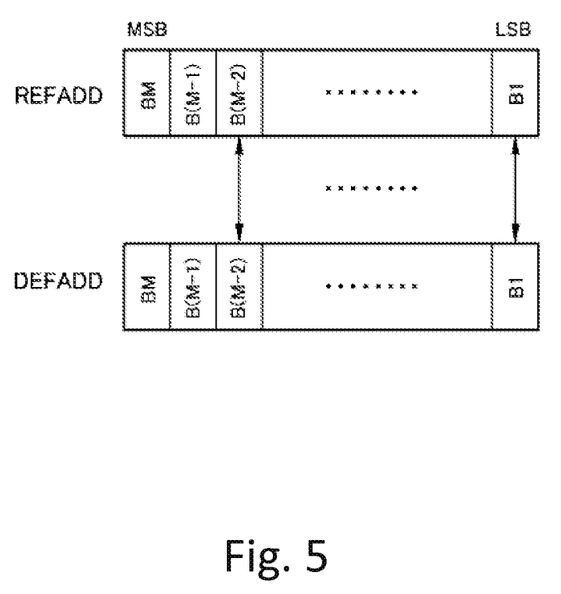
FIG. 5 is a schematic diagram explaining a second example of the comparison method carried out by the comparison circuit.

FIG. 5 is a schematic diagram explaining a second example of the comparison method carried out by the comparison circuit 25. In the example of FIG. 5, the comparison circuit 25 compares the refresh address REFADD and the row address DEFADD in such a way that their (M−2)-bit portions not including two high-order bits, i.e., portions including B(M−2) bit to B1 bit, are compared with each other. When the (M−2)-bit portions of the refresh address REFADD and the row address DEFADD matches, the comparison circuit 25 activates the detection signal HIT. In this example, the comparison is made with the two high-order bits, i.e., BM bit and B(M−1) bit being set aside. As a result, the detection signal HIT is activated four times for one row address DEFADD as the refresh counter 21 completes its one round of count value updating. In this case, the frequency of refreshing memory cells on the row address DEFADD is four times the frequency of refreshing memory cells on a row address other than the row address DEFADD.

In this manner, when the above comparison is made with high-order K bit being set aside, the frequency of refreshing on the row address DEFADD is determined to be N (N=2K) times the frequency of refreshing on a row address other than the row address DEFADD.

As described above, when the detection signal HIT is activated, the selection control circuit 22 selects the M-bit row address HITADD, instead of selecting the refresh address REFADD, and supplies the row address HITADD to the multiplexer 23. As a result, the refresh operation is not executed on a word line indicated by the refresh address REFADD but executed on a word line indicated by the row address HITADD. When the detection signal HIT is activated, the selection control circuit 22 supplies an updating stop signal STP to the refresh counter 21, thereby temporarily suspends its count value updating operation. When the detection signal HIT is activated, therefore, the refresh operation on the word line indicated by the row address HITADD is executed as an interruption process.

While suspending the updating operation of the refresh counter 21 through the updating stop signal STP, the selection control circuit 22 must invalidate the detection signal HIT responding to the next refresh signal IREF. This process is necessary because when the updating operation of the refresh counter 21 is suspended, the detection signal HIT is activated for the interruption process during which a count value of the refresh counter 21 is not updated until activation of the next refresh signal IREF.

As a result of this process, when the next refresh signal IREF is activated, the refresh address REFADD is certainly selected and a count value of the refresh counter 21 is updated.

As described above, the refresh control circuit 20 allows an increase in the frequency of refreshing of a given memory cell storing user data DQ whose error is detected by the error correction circuit 31. When the error is caused by a refreshing failure, therefore, the address of the memory cell is refreshed more frequently to allow the memory cell to be treated as a normal memory cell. When the error is caused by a refreshing failure, a different memory cell sharing a word line with a memory cell having a refreshing failure problem is also likely to have a refreshing failure problem. According to this embodiment, however, the shared word line is refreshed more frequently, which prevents the occurrence of an additional refreshing failure. In addition, according to this embodiment, the frequency of refreshing of a specific address is increased. As a result, an increase in current consumption may be less in comparison to conventional memories.

Figure 6:
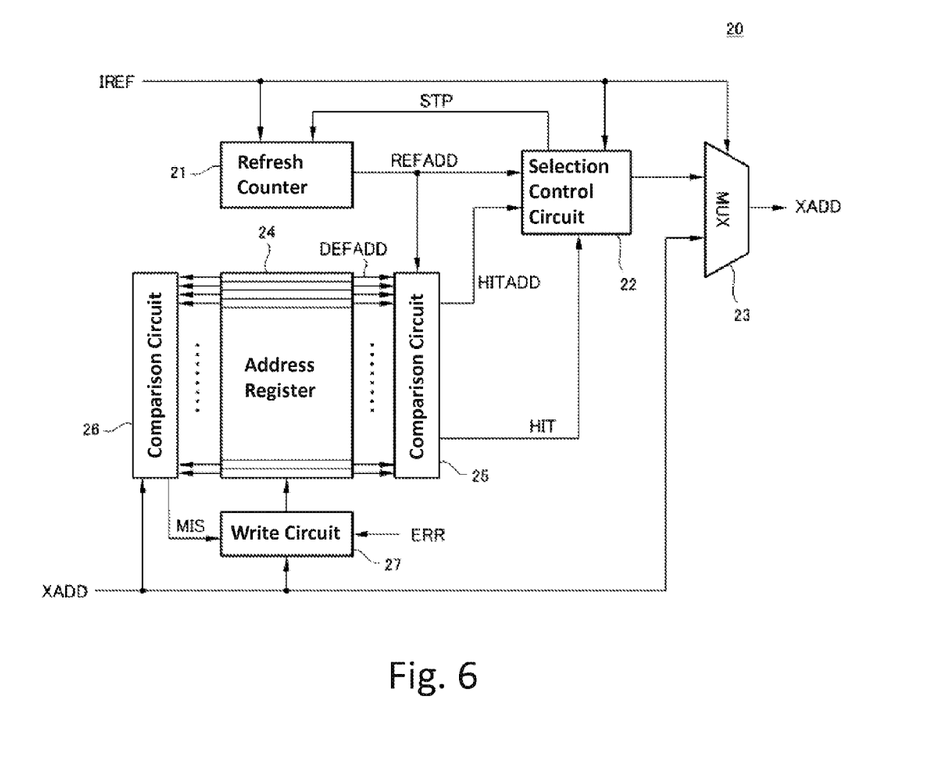
FIG. 6 is a block diagram of a configuration of a refresh control circuit according to a second embodiment.

FIG. 6 is a block diagram of a configuration of the refresh control circuit 20 according to a second embodiment. The refresh control circuit 20 of FIG. 6 is different from the refresh control circuit 20 of FIG. 3 in that the refresh control circuit 20 of FIG. 6 further can include a comparison circuit 26 and a write circuit 27. In other aspects, the refresh control circuit 20 of the second embodiment is identical with the refresh control circuit 20 of the first embodiment. The same constituent elements as described in the first embodiment, therefore, will be denoted by the same reference numerals and redundant description will be omitted.

The comparison circuit 26 compares a row address XADD to which access is required with a row address DEFADD stored in the address register 24. When the row address DEFADD completely matching the row address XADD is not stored in the address register 24, the comparison circuit 26 activates a detection signal MIS, which is supplied to the write circuit 27. When the detection signal MIS and an error signal ERR are both activated, that is, when the activated detection signal MIS and error signal ERR are supplied to the write circuit 27, the write circuit 27 supplies a row address XADD present on the input terminal of the write circuit 27, to the address register 24. This process means that when a row address XADD to be newly written to the address register 24 has already been written thereto, writing the row address XADD to the address register 24 is forbidden.

In this manner, the refresh control circuit 20 of FIG. 6 having the comparison circuit 26 can prevent redundant writing of the same row address XADD to the address register 24. Even if access is performed repeatedly to the same error-including user data DQ, therefore, the address register 24 stores only one row address XADD corresponding to the user data DQ. According to the second embodiment, therefore, capacity of the address register 24 can be reduced to be smaller than the same of the first embodiment.

Figure 7:
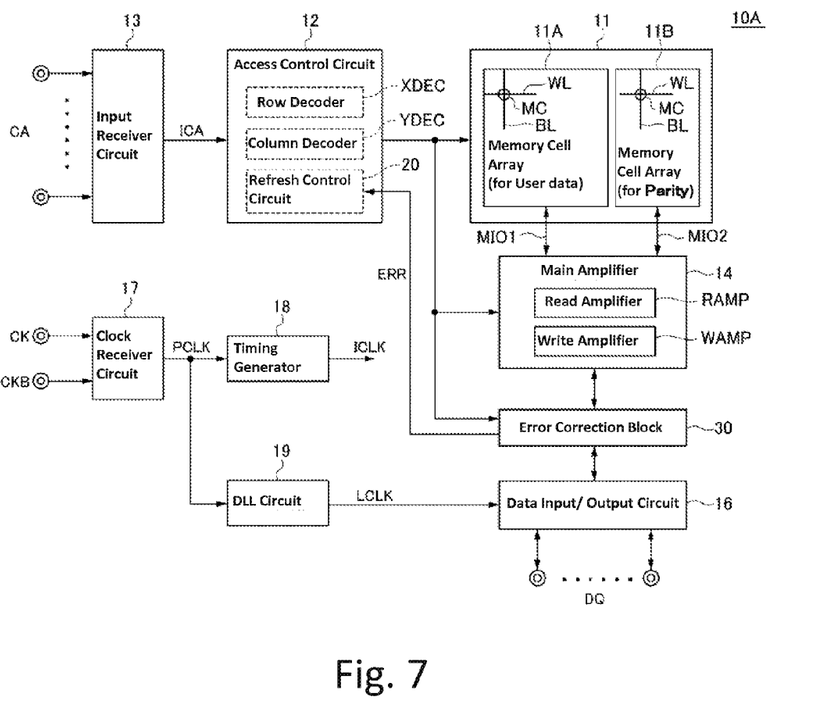
FIG. 7 is a block diagram of a configuration of a modification of the semiconductor device.

FIG. 7 is a block diagram of a configuration of a semiconductor device 10A as a modification of the semiconductor device of FIG. 1.

The semiconductor device 10A is different from the semiconductor device of FIG. 1 in that in the semiconductor device 10A, the memory cell array 11B stores a parity bit of user data DQ and the error correction block 15 is replaced with a verification circuit 30. In other aspects, the semiconductor device 10A is identical with the semiconductor device of FIG. 1. The same constituent elements as described in the first embodiment, therefore, will be denoted by the same reference numerals and redundant description will be omitted.

The parity bit stored in the memory cell array 11B represents verification data, and one parity bit is assigned to multiple bits making up the user data DQ. By this verification method based on the parity bit, therefore, whether the read user data DQ includes an error or not can be determined but the error itself cannot be corrected. When determining that the read user data DQ includes an error, the verification circuit 30 activates the error signal ERR. As a result, based on the error signal ERR, the row address DEFADD is stored in the address register 24 included in the refresh control circuit 20.

In this manner, according to this embodiment, correcting a detected error of the user data DQ is not essential, and merely detecting an error may be enough, as in the case of the modification of FIG. 7. According to this embodiment, the user data DQ including an error is output from the semiconductor device, as error-including data. The error of the user data DQ, however, is corrected by, for example, a memory controller.

The preferred embodiments of the present invention have been described above. The present invention is not limited to the above embodiments but may be modified into various forms of applications on the condition that the modification does not deviate from the substance of the invention. Obviously, the modified forms of applications are also included in the scope of the present invention.

What is claimed is:

1. A device comprising:
   a plurality of memory cells;
   an error detection circuit configured to detect at least one memory cell storing error data; and
   a refresh control circuit comprising:
   a register configured to store an error address corresponding to the at least one memory cell storing the error data, to provide the error address, and to control a refresh cycle of the error address;

a refresh counter capable of having a value corresponding to an address of a memory cell of the plurality of memory cells, the refresh counter configured to provide the value of the address of the memory cell;

a comparison circuit configured to receive, from the register, the error address, to receive, from the refresh counter, the value of the address of the memory cell, and to compare a portion of the error address stored in the register with a portion of the address of the memory cell, the portion of the error address being less than all of the error address, the portion of the address of the memory cell being less than all of the address of the memory cell, the comparison circuit further configured to output, when the error address is determined to be a matched error address based on a match between the portion of the error address stored in the register and the portion of the address of the memory cell, the matched error address; and a selection control circuit configured to receive the matched error address, to select between the matched error address provided by the comparison circuit and the address of the refresh counter, and to output the matched error address when the portion of the error address is determined by the comparison circuit to be coincident with the portion of the value of the refresh counter.

2. The device as claimed in claim 1,
wherein the refresh control circuit is configured to perform a refresh operation on the at least one memory cell corresponding to the error address at a first refresh frequency and on a memory cell storing no-error data at a second refresh frequency, and
wherein the first refresh frequency is higher than the second refresh frequency.

3. The device as claimed in claim 1,
wherein the selection control circuit is configured to select and output the value when the portion of the error address is not coincident with the portion of the value of the refresh counter.

4. The device as claimed in claim 3,
wherein the portion of the error address is the address information excluding a most significant bit thereof.

5. The device as claimed in claim 3,
wherein the portion of the error address is the address information excluding two high-order bits thereof.

6. The device as claimed in claim 1,
wherein the comparison circuit is configured to compare the portion of the error address stored in the register with an address for a read or write operation on a memory cell of the plurality of memory cells.

7. The device as claimed in claim 6,
wherein the comparison circuit is configured to prohibit the register from storing the address for the read or write operation when the error address stored in the register is coincident with the address for read or write operation.

8. A device comprising:
a memory cell array device including first and second memory cell arrays, the first memory cell array comprising a plurality of first memory cells configured to store user data, the second memory cell array comprising a plurality of second memory cells configured to store verification data relating to the user data;

a verification circuit configured to receive the user data from the first memory cell array, to receive the verification data from the second memory cell array, to check whether the user data includes an error, by using the verification data, and to provide, when the user data includes the error, an error signal; and a refresh control circuit configured to:
execute a refresh operation on the first memory cell array in order to increase a frequency of the refresh operation on a memory cell storing the error, wherein the refresh control circuit comprises an address register configured to receive, from the verification circuit, the error signal, wherein the address register is further configured to provide an address corresponding to the memory cell storing the error, wherein the refresh control circuit comprises a comparison circuit configured to receive the address, and to compare a portion of the address with a portion of an address of the plurality of first memory cells, wherein the portion of the address corresponding to the memory cell storing the error is less than all of the address corresponding to the memory cell storing the error, and wherein the portion of the address is less than all of the address, activate a detection signal when the portion of the address corresponding to the memory cell storing the error is determined to be a matched error address based on a match between the portion of the address and the portion of the address of the plurality of first memory cells, and output, to the memory cell array device, the matched error address, based on the activated detection signal, and wherein the refresh operation is performed while a refresh counter completes a round of count value.

9. The device as claimed in claim 8, wherein the refresh control circuit comprises a refresh counter capable of having the value corresponding to the address of the plurality of first memory cells.

10. The device as claimed in claim 9,
wherein the refresh control circuit comprises a selection control circuit configured to select and output the address corresponding to the memory cell storing the error data when the portion of the address is coincident with a portion of the value.

11. The device as claimed in claim 10,
wherein the selection control circuit is configured to select and output the value when the portion of the address is not coincident with the portion of the value.

12. The device as claimed in claim 11,
wherein the portion of the address is the address information excluding a most significant bit thereof.

13. The device as claimed in claim 8
wherein the refresh control circuit comprises a comparison circuit configured to compare the address stored in the address register with an address for a read or write operation on a memory cell of the first memory array.

14. A device comprising:
a plurality of word lines each coupled to a plurality of memory cells on which a refresh operation is performed in order to retain information stored therein;
a refresh control circuit configured to control the refresh operation; and
a verification circuit configured to receive data on at least first and second word lines among the plurality of word lines, to check the data on the at least first and second word lines among the plurality of word lines, and to provide, when the received data includes the error, an error signal, wherein the refresh control circuit is configured to receive the error signal, wherein, responsive to a comparison of a portion of an error address provided based on the received error signal with a portion of an address of the plurality of memory cells, the refresh control circuit is configured to change a frequency of the refresh operation on the first word line to a first frequency by outputting, from the verification circuit and at the first frequency, the error address that has the portion determined to match the portion of the address of the plurality of memory cells, wherein the portion of the error address is less than all of the error address and the portion of the address of the plurality of memory cells is less than all of the address of the plurality of memory cells, and wherein the error address output at the first frequency is associated with the first word line, and the refresh control circuit is further configured to keep a frequency of the refresh operation on the second word line which is clear from an error at a second frequency, and to perform a refresh operation while a refresh counter completes one round of count value updating.

15. The device as claimed in claim 14, wherein the frequency of the refresh operation on the first word line is N times (N is power of two) more than the frequency of the refresh operation on the second word line, wherein N is a number power of two.

16. The device as claimed in claim 15, wherein the refresh control circuit comprises a refresh counter configured to produce a count value corresponding to an address for the refresh operation, and wherein the refresh control circuit is configured to perform the refresh operation on the first word line at least twice while the refresh counter completes a cycle of counting of the count value.

\* \* \* \* \*